United States Patent
Kasahara (10) Patent No.: US 8,248,174 B2
(45) Date of Patent: *Aug. 21, 2012

(54) SURFACE MOUNTED OVEN CONTROLLED TYPE CRYSTAL OSCILLATOR

(75) Inventor: Kenji Kasahara, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/931,300

(22) Filed: Jan. 28, 2011

(65) Prior Publication Data

US 2011/0193637 A1 Aug. 11, 2011

(30) Foreign Application Priority Data

Feb. 5, 2010 (JP) ................................. 2010-023667

(51) Int. Cl.
*H03B 1/00* (2006.01)
(52) U.S. Cl. ............................. 331/69; 331/68; 331/158
(58) Field of Classification Search .................... 331/68, 331/69, 158; 310/348
See application file for complete search history.

(56) References Cited

U.S. PATENT DOCUMENTS

| 5,917,272 A * | 6/1999 | Clark et al. ................. 310/343 |
| 7,023,291 B2 * | 4/2006 | Kato et al. ................... 331/158 |
| 8,049,572 B2 * | 11/2011 | Arai et al. ..................... 331/176 |

FOREIGN PATENT DOCUMENTS

| JP | 2005-341191 | 12/2005 |
| JP | 2009-232239 | 10/2009 |

* cited by examiner

*Primary Examiner* — Joseph Chang
(74) *Attorney, Agent, or Firm* — Scott D. Wofsy; Edwards Wildman Palmer LLP (57) ABSTRACT

The invention relates to an oven controlled crystal oscillator for surface mounting with reduced height (low profile). The oven controlled crystal oscillator for surface mounting comprises: a flat first substrate made of ceramic and on which are installed a crystal device and a heat resistor; and a second substrate made of a glass epoxy resin which is quadrangular in plan view and which faces the first substrate and has a larger external shape in plan view than the first substrate. The second substrate has an opening into whose center the crystal device is inserted, and has terminal sections on four locations corresponding to the surface outer periphery of the first substrate and the peripheral surfaces of the opening in the second substrate, and the terminal sections of the first substrate and second substrate are connected by solder. A front end side head section of the crystal device inserted into the opening section of the second substrate is positioned inside the open surface of the opening section, and from terminal sections provided at four locations on the second substrate, conductive paths extend via the outside surface of the second substrate to external terminals formed on the outside bottom surface of the second substrate.

10 Claims, 12 Drawing Sheets

SURFACE MOUNTED OVEN CONTROLLED TYPE CRYSTAL OSCILLATOR

BACKGROUND OF THE INVENTION

1. Technical Field

The present invention relates to an oven controlled type crystal oscillator for surface mounting (hereafter "oven controlled oscillator"), in particular to an oven controlled oscillator which facilitates a low profile.

2. Background Art

Oven controlled oscillators, being able to impart a constant operating temperature to crystal resonators in particular, can eliminate frequency changes that result from frequency temperature characteristics, thereby stabilizing the oscillation frequency. Thus, stability of the oscillation frequency is obtained in the order of parts per billion, for example, for such applications as a frequency source in a base station. In recent years, although such highly stable oven controlled crystal oscillators have been reduced in size and adapted for surface mounting, demand exists for further reductions in height.

3. Prior Art

Figure 11A:
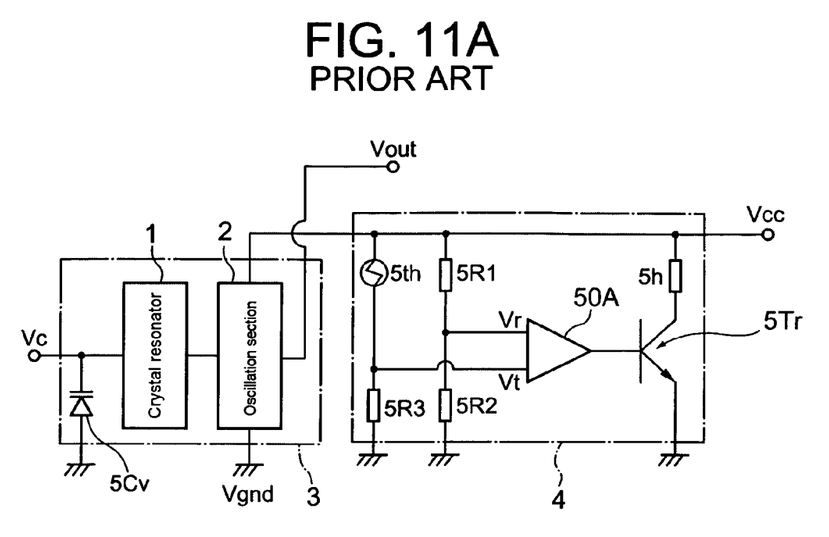
FIG. 11A is a schematic circuit diagram.
Figure 11B:
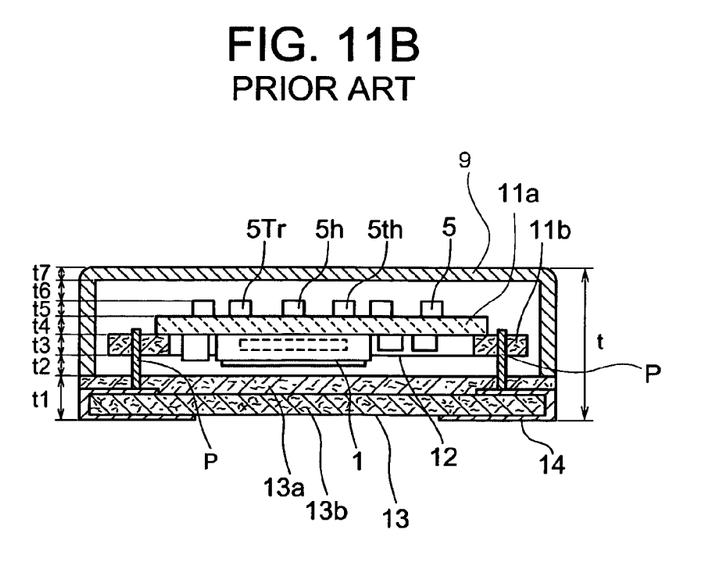
FIG. 11B is a cross-sectional view showing the construction thereof.
Figure 12:
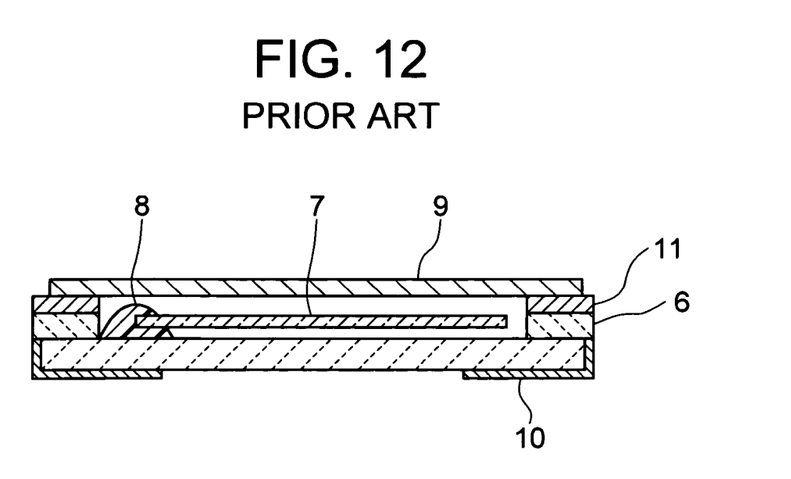
FIG. 12 is a cross-sectional view for describing a conventional example of a crystal resonator.

FIG. 11A, 11B, and FIG. 12 illustrate a conventional example of an oven controlled oscillator, wherein FIG. 11A is a schematic circuit diagram of the oven controlled oscillator, FIG. 11B is a cross-sectional view of the construction thereof, and FIG. 12 is a cross-sectional view of a crystal resonator.

The conventional oven controlled oscillator, as shown in FIG. 11A, comprises an oscillation circuit 3 having a crystal resonator 1 and an oscillation section 2, and a temperature control circuit 4 which imparts a constant operating temperature to the crystal resonator 1 in particular. The oscillation circuit 3 is, for example, a Colpitts type, subject to voltage control by the connection of a voltage variable capacitative element 5Cv to the crystal resonator 1. The oscillation circuit 3, in addition to an oscillation stage (oscillation section), also comprises a buffer stage, for example.

Figure 13:
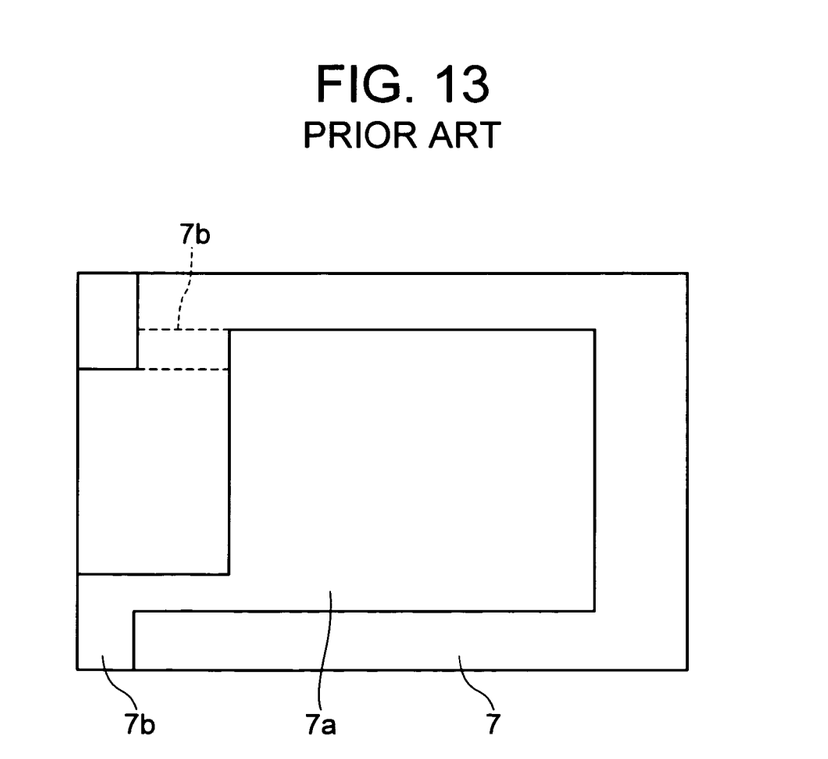
FIG. 13 is a plan view for describing a conventional example of a crystal blank.

The crystal resonator 1, as shown in FIG. 12, for example, accommodates a crystal blank 7 within a chamber body 6 having a concave shape in cross-section. The crystal blank 7, as shown in FIG. 13, has excitation electrodes 7a on both principal surfaces thereof, and, for example, lead-out electrodes 7b extend to both sides of one end thereof. As shown in FIG. 12, the both sides of one end from which the lead-out electrodes 7b extend are fixed to the inside bottom surface of the chamber body 6 by an electrically conductive adhesive 8. Furthermore, a metal cover 9 is joined by seam welding or the like to a metal ring 11 provided at the open end surface of the chamber body 6, so as to hermetically seal the crystal blank 7 within the chamber body 6. On the outside bottom surface of the chamber body 6, external terminals 10 are provided of which two are electrically connected to each of the excitation electrodes 7a and lead-out electrodes 7b of the crystal blank 7, and the metal cover 9.

The temperature control circuit 4, as shown in FIG. 11A, comprises an op-amp 50A and a power transistor 5tr. The op-amp 50A compares a reference voltage derived from divided voltage resistors 5 (R1, R2) against a temperature detection voltage derived from a divided voltage resistor 5R3 with a thermal sensor, for example a thermistor 5th, at one input, and outputs a control voltage. The power transistor 5Tr increases or decreases the collector current based on the control voltage, thereby controlling the heat generated by a chip resistor (hereafter "heating resistor") 5h serving as the heat-generating resistor. As a result, in particular, the operating temperature of the crystal resonator 1 is controlled constant.

In such an oven controlled oscillator, as shown in FIG. 11B, for example, a first substrate 11a and a second substrate 11b are installed on a surface mounting base 13 by metal pins P, and a metal cover 9 is bonded thereto. On each of the first and second substrates 11a and 11b, circuit patterns are formed which are not shown in the figure. The first substrate 11a is made of a flat piece of ceramic, and the second substrate 11b is made of a glass epoxy resin with an opening section 12 at its center and has larger external dimensions in plan view than the first substrate 11a. Moreover, in the surface mounting base 13, at least the surface mounted oscillator 1 is disposed on the opposing bottom surface side of the first substrate 11a, and on the top surface side thereof are disposed, for example, the heating resistor 5h, the thermal sensor 5th such as a thermistor, and the power transistor 5tr. Other circuit elements 5 associated with the oscillation circuit 3 and the temperature control circuit 4 are disposed in the outer peripheral sections of the top and bottom surfaces of the first substrate 11a.

On the bottom surface side of the first substrate 11a, so as to face the second substrate 11b, the circuit elements 5 including the crystal resonator 1 on the bottom surface side are inserted into the opening section 12 of the second substrate 11b. Furthermore, the outer periphery of the first substrate 11a is joined to the peripheral surface of the opening section 12 of the second substrate 11b. For example, the ends of the circuit pattern which extend to the four outer peripheral corners of the first substrate 11a and the corresponding one end of the circuit pattern of the second substrate 11b are electrically joined by solder or the like. Furthermore, the other end of the circuit pattern of the second substrate 11b extends to the small openings at the four corners where the metal pins P are inserted.

The surface mounting base 13 is, for example, made of a glass epoxy resin in a dual layer of substrates 13a and 13b. Furthermore, external terminals 14 serving as mounting terminals extending from electrode pads at the lamination plane via the outer surface, are provided at the four corners of the outside bottom surface of the surface mounting base 13. At the four corners of the surface mounting base, metal pins P are provided which are joined to the electrode pads by solder (not shown). The metal pins P are inserted into the small openings at the four corners of the second substrate 11b, and are electrically connected to the other end of the circuit pattern by solder while holding the second substrate 11b in place.

By this construction, particularly because the first substrate 11a is ceramic having excellent thermal conductivity, and the heating resistor 5h and the crystal resonator 1 are disposed thereon, thermal conductivity to the crystal resonator 1 is enhanced. Furthermore, the outer periphery of the first substrate 11a faces and electrically connects to the second substrate 11b made of a glass epoxy resin which has poor thermal conductivity, and the outer periphery of the second substrate 11b is held in place by metal pins P connected to the external terminals 14. Accordingly, because the heat produced by the first substrate 11a (made of ceramic) is shielded by the second substrate 11b (made of epoxy resin), thermal efficiency is enhanced. Moreover, because the first substrate 11a and the second substrate 11b, as in the prior art (patent document 2), do not need to adopt a two-tiered construction using metal pins P, the height of the oven controlled oscillator can be reduced.

REFERENCE DOCUMENTS

[Patent Document 1] Japanese Unexamined Patent Publication No. 2009-232239

[Patent Document 2] Japanese Unexamined Patent Publication No. 2005-341191

SUMMARY OF THE INVENTION

Problems to be Solved by the Invention (Problems in Prior Art)

However, in the conventional oven controlled oscillator of the above configuration, as shown in FIG. 11B, because the second substrate 11b joined to the first substrate 11a is held in place on the surface mounting base 13 using metal pins P, a problem occurred in that the height thereof could not be sufficiently reduced. In this conventional example, for example, the thickness t1 of the surface mounting base 13 is 1.2 mm, the clearance t2 from the surface mounting base 13 to the second substrate 11b is 0.5 mm, the thickness t3 of the second substrate 11b is 0.8 mm, the thickness t4 of the first substrate 11a is 0.5 mm, the maximum thickness t5 of the circuit elements 5 is 0.9 mm, the clearance t6 from the first substrate 11a to the metal cover 9 is 0.8 mm, and the thickness t7 of the metal cover 9 is 0.3 mm. The thickness of the external terminals 14 of the surface mounting base 13, being no more than 40 μm, is not shown.

Therefore, the overall height of the surface mounted oven controlled oscillator is approximately 5.0 mm in this conventional example, and no oscillator with a height of 5.0 mm or less is commercially available at present. Accordingly, the height is significantly greater than, for example, non-oven controlled oscillators such as temperature compensated crystal oscillators (TCXO) which have thicknesses of 2.0 mm or less, and a reduction in height is thus demanded.

(Object of the Invention)

An object of the present invention is to provide an oven controlled oscillator for surface mounting whose height is further reduced.

Means for Solving the Problem

The present invention is an oven controlled crystal oscillator for surface mounting comprising: a first substrate made of ceramic which is quadrangular in plan view and on which are installed at least a surface mounted crystal device having mounting terminals on the outside bottom surface and a heat resistor; and a quadrangular second substrate made of a glass epoxy resin which faces the first substrate in alignment in the length direction and the width direction and has a larger external shape in plan view than the first substrate, in which the second substrate has an opening into whose center the crystal device is inserted, the crystal device has terminal sections at four locations corresponding to the surface outer periphery of the first substrate where the crystal device is installed and the peripheral surfaces of the opening in the second substrate, and the terminal sections of the first and second substrates are electrically and mechanically connected by solder. The front end side head section of the crystal device inserted into the opening section of the second substrate is positioned inside the open surface of the opening section, and from terminal sections provided at four locations on the second substrate, conductive paths extend via the outside surface of the second substrate to external (mounting) terminals formed on the outside bottom surface.

Effects of the Invention

With such a construction, the ceramic first substrate on which circuit elements including a crystal device for surface mounting are installed, faces the glass epoxy resin second substrate having mounting terminals on the outside bottom surface, and is electrically and mechanically connected thereto. Furthermore, the oven controlled oscillator is constructed with the front end side head section of the crystal device disposed inside the open surface of the second substrate. Accordingly, in comparison to the case of the conventional example in which the second substrate surface-bonded to the first substrate is held in place upon the surface mounting base by metal pins, the height dimension of the oven controlled oscillator can be greatly reduced. Moreover, because the crystal device is disposed within the open surface of the opening section of the second substrate, by means of the external (mounting) terminals provided on the outside bottom surface of the second substrate, a surface mountable oven controlled oscillator is obtained.

Furthermore, the first substrate on which the crystal device and heating resistor are provided is composed of ceramic, and the crystal device enters and is located inside the open surface of the opening section of the second substrate made of glass epoxy resin. Accordingly, the oven-controlled oscillator, when surface-mounted with other electronic components onto a set substrate (typically made of glass epoxy resin), is surrounded such that the outside bottom surface of the crystal device faces the first substrate (ceramic) which has the resistor as a heat source and offers good thermal conductivity, the four outside surfaces thereof face the inside of the opening section of the second substrate (glass epoxy resin) which has a shielding effect due to poor thermal conductivity, and the front end side faces the set substrate. Thus, the opening section forms a so-called pseudo-enclosed space.

Accordingly, the heat produced by the heating resistor is retained inside the opening section 12 and cannot easily escape, enabling the efficient utilization of heat energy and simplifying temperature control. In this case, because the heating resistor need only heat the first substrate (made of ceramic), the heating resistor can be disposed on the one principal surface where the crystal device is located, on the other principal surface opposite from the first principal surface, in a depression provided in the substrate, or can even be embedded into the substrate.

(Aspects of the Embodiments)

According to the present invention, of the terminal sections provided at four locations on the second substrate, two each are provided on each of a pair of opposing sides, and two each of the external terminals of the second substrate are provided on each of the other pair of opposing sides orthogonal to the first pair of opposing sides. Accordingly, even if the second substrate has a smaller shape in plan view, the terminal sections and the external terminals can be disposed without an electrical short occurring, enabling the external shape in plan view to be made compact.

Furthermore, in the present invention, the quadrangular shape is a rectangle, with the one pair of opposing sides where two each of the terminal sections are provided being the sides in the length direction, and the other pair of opposing sides where two each of the mounting terminals are provided being the sides in the width direction. As a result, the quadrangular shape, in comparison to a case where two each of the terminal sections and external terminals are provided on both sides in the length direction, for example, can be shorter in the length direction and adopt a more compact shape in plan view.

In addition, according to the present invention, on the one principal surface of the first substrate, the crystal device and at least the heating resistor are provided and inserted into the opening section in the second substrate. As a result, in comparison to a case where the heating resistor is provided on the other principal surface on the opposite surface from the one principal surface, the heating resistor is disposed in a pseudo-enclosed space and shielded by the inner periphery of the second substrate made of glass epoxy resin and the set substrate. Accordingly, because the inside of the opening section (pseudo-enclosed space) is heated directly, thermal energy can be utilized efficiently.

According to the present invention, the heating resistor is formed as a film resistor on the one principal surface of the first substrate so as to face the outside bottom surface of the crystal device. As a result, because the outside bottom surface of the crystal device and the film resistor face each other, heat from the film resistor is supplied to the entirety of the outside bottom surface, improving responsiveness to heat.

Furthermore, according to the present invention, the crystal device is composed of a crystal resonator hermetically sealing a crystal blank, and on the one principal surface of the first substrate where the crystal resonator is disposed and also on the other principal surface on the opposite side, circuit elements other than the heating resistor, for oscillation and temperature control are disposed. As a result, an oven controlled oscillator in which the configuration of the present invention is even more specific, can be formed.

In addition, according to the present invention, of the circuit elements disposed on the one principal surface and the other principal surface of the first substrate, the circuit elements disposed on at least one of the principal surfaces are covered by a metal cover for shielding. This acts as a so-called EMI (electro-magnetic interference) countermeasure.

According to the present invention, the crystal device is composed of a crystal resonator hermetically sealing a crystal blank, and a circuit element including an IC chip which integrates at least an oscillation circuit is disposed on the first principal surface of the first substrate where the crystal resonator is installed, with the entire surface of the other principal surface of the first substrate left exposed. As a result, the height dimension of the oven controlled oscillator can be reduced further.

According to the present invention, as an EMI countermeasure, on the other principal surface of the first substrate, a metal film for shielding is provided.

According to the present invention, the crystal device is a crystal oscillator which hermetically seals a crystal blank and an IC chip that integrates at least an oscillation circuit 3. In this case, because the crystal oscillator that hermetically seals the crystal blank and the IC ship is installed on a set substrate and sealed inside an opening section in the second substrate which forms a pseudo-enclosed space, the temperature inside the crystal oscillator can be further stabilized.

BRIEF DESCRIPTION OF THE DRAWINGS

FIG. 1 is diagrams for describing a first embodiment of a surface mounted oven controlled oscillator of the present invention, wherein

FIG. 3 is diagrams of a first substrate which is a component of the first embodiment of a surface mounted oven controlled oscillator of the present invention, wherein

FIG. 4 is diagrams of a second substrate which is a component of the first embodiment of a surface mounted oven controlled oscillator of the present invention, wherein

FIG. 6 is diagrams for describing another example of the first embodiment of the oven controlled oscillator of the present invention, wherein

FIG. 7 is diagrams for describing a second embodiment of the oven controlled oscillator of the present invention, wherein

FIG. 9 is diagrams for describing a third embodiment of the oven controlled oscillator of the present invention, wherein

FIG. 10 is diagrams for describing a fourth embodiment of the oven controlled oscillator of the present invention, wherein

FIG. 11 is diagrams for describing a conventional example of an oven controlled oscillator, wherein

BEST MODE FOR CARRYING OUT THE INVENTION

First Embodiment

Figure 1A:
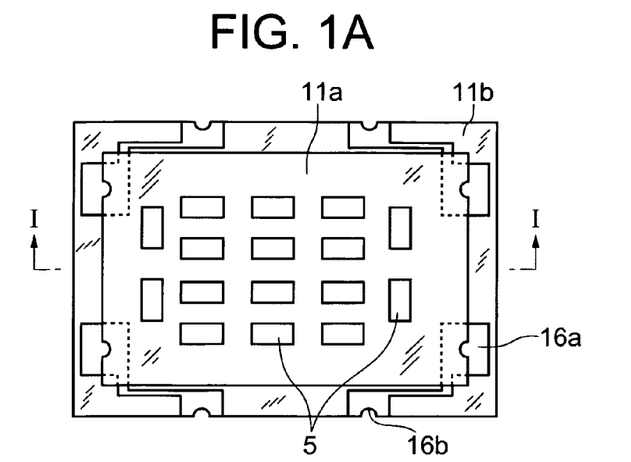
FIG. 1A is a plan view.

As follows is a description of a first embodiment of an oven controlled oscillator of the present invention with reference to FIG. 1 (plan view (FIG. 1A), cross-sectional view (FIG. 1B), and bottom view (FIG. 1C) of oven controlled oscillator), FIG. 2 (front view of same), FIG. 3 (first substrate), and FIG. 4 (second substrate).

Figure 1B:
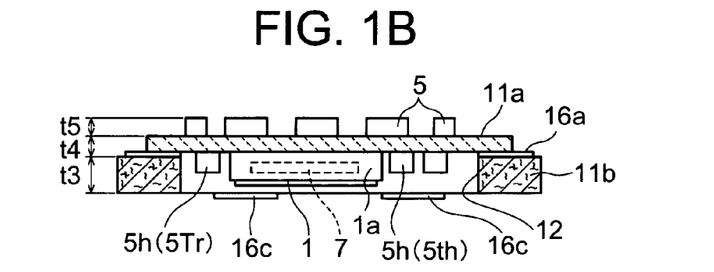
FIG. 1B is a cross-sectional view along the line I-I in FIG. 1A.
Figure 2:
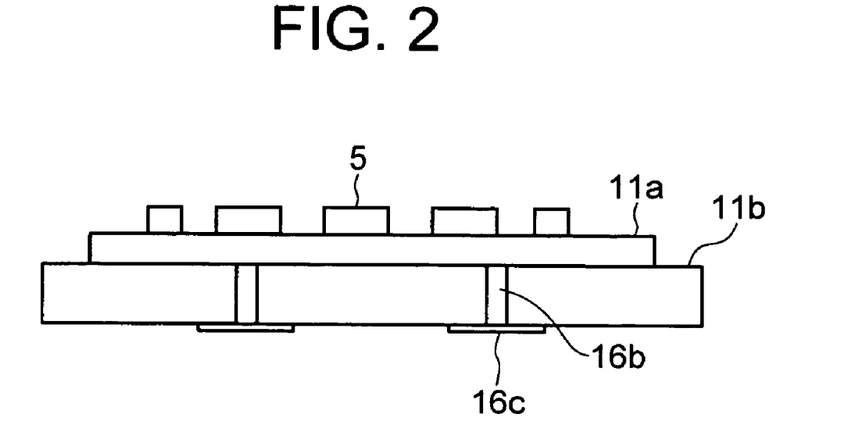
FIG. 2 is a plan view showing the first embodiment of the surface mounted oven controlled oscillator of the present invention.

The oven controlled oscillator of the present invention, as shown in FIG. 1B, comprises a flat first substrate 11a made of ceramic, and a second substrate 11b which is made of a glass epoxy resin and has an opening section 12 at its center. The first substrate 11a and the second substrate 11b are both a quadrangle shape in plan view, in this case rectangular, the second substrate 11b has larger external dimensions in plan view than the first substrate, and the substrates face each other in alignment in the width direction and the length direction. Furthermore, on one principal surface of the first substrate 11a serving as the bottom surface side, a crystal resonator 1 hermetically sealing a crystal blank 7 and having mounting terminals (not shown) on the outside bottom surface is disposed at the center region, and circuit elements 5 are disposed on the outer periphery as well as the other principal surface (top surface side) on the opposite side from the one principal surface.

Here, the circuit elements 5 on the one principal surface (bottom surface side) of the first substrate 11a include at least a heating resistor 5h, a power transistor 5Tr, and a thermal sensor 5th, which are disposed surrounding the crystal resonator 1. In this example, particularly those circuit elements 5 such as the voltage variable capacitative element 5Cv whose characteristics are temperature-dependent, are placed at the outer peripheral side. Furthermore, on the other principal surface (top surface side) of the first substrate 11a are provided the circuit elements 5 for oscillation and temperature control which are not provided on the principal surface.

The circuit elements 5 enclosing the crystal resonator 1 disposed in the center region of the one principal surface of the first substrate 11a enter and are located inside the opening section 12 of the second substrate 11b. In this case, the front end side head section (the metal cover 9 side according to FIG. 11B) of the crystal resonator 1 which is greatest in height, as shown in FIG. 1B, without protruding from the open surface of the second substrate 11b, is installed within the open surface of the second substrate 11b. Furthermore, the outer periphery of the one principal surface of the first substrate 11a is joined to the peripheral surfaces of the opening section 12 of the second substrate 11b.

Figure 3A:
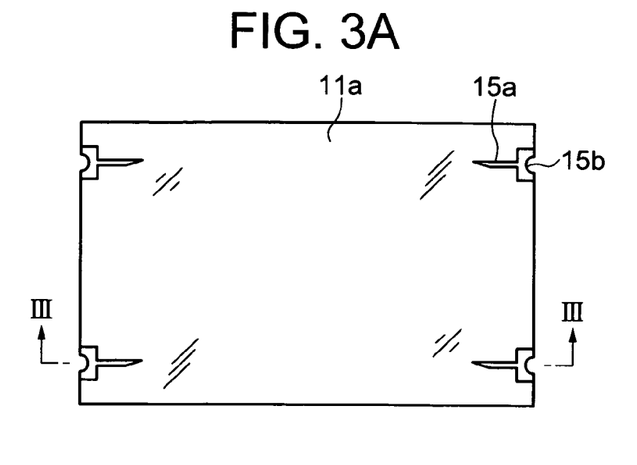
FIG. 3A is a plan view.
Figure 3B:
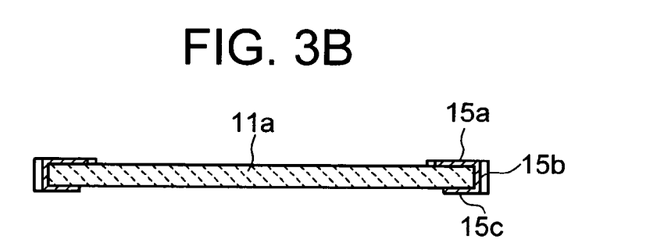
FIG. 3B is a cross-sectional view along the line in FIG. 3A.
Figure 3C:
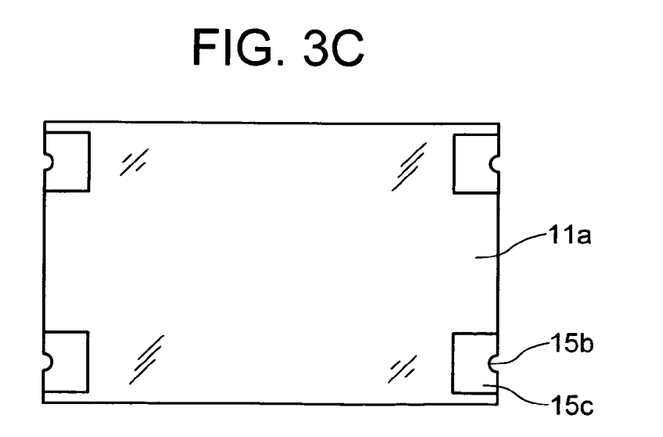
FIG. 3C is a bottom view.

Here, as shown in FIG. 3, on the other principal surface on the top surface side of the first substrate 11a where the circuit elements 5 for oscillation and temperature control are disposed, a circuit pattern (not shown) which electrically connects the circuit elements 5 is formed. Furthermore, conductive paths 15a of the circuit pattern extend from both corners of both ends in the length direction of the first substrate 11a, and electrically connect to terminal sections 15c at the four corners of the bottom surface via end face electrodes 15b formed by through hole processing. Of the terminal sections 15c provided at the four corners, two are provided at both ends in the length direction of the lead-out electrodes 11, that is, at both corners of the pair of opposing sides.

Figure 4A:
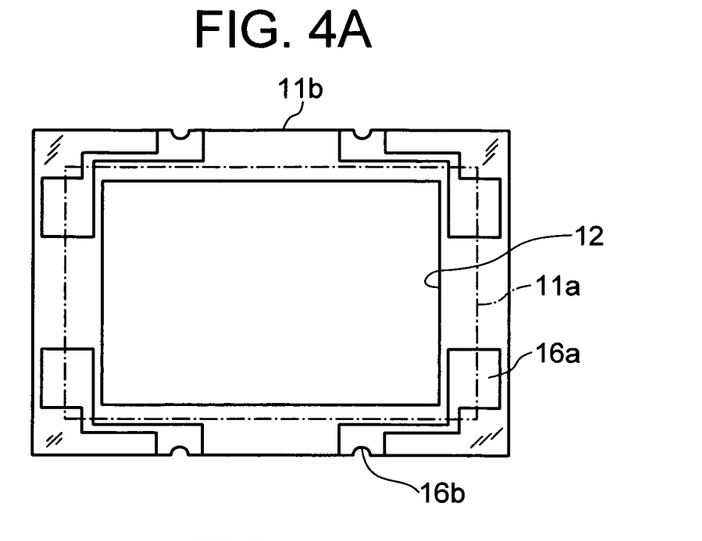
FIG. 4A is a plan view.

On the top surface of the second substrate 11b which faces the first substrate 11a, as shown in FIG. 4A, terminal sections 16a are provided at both corners of the pair of opposing sides in the length direction corresponding to the terminal sections 15c of the first substrate 11a. Furthermore, each terminal section 16a is electrically connected to an external terminal 16c on the bottom surface serving as a mounting electrode, via an end face electrode 16b formed by through hole processing of the adjacent end in the width direction, that is, the other pair of opposing sides. Essentially, two of the external terminals 16c on the bottom surface of the second substrate 11b are provided on each of the other pair of opposing sides orthogonal to the pair of opposing sides on which two each of the terminal sections 16a are provided. Furthermore, the total of four terminal sections 15 and 16, of which two are provided at both ends in the length direction of the first substrate 11a and the second substrate 11b, are joined by solder (not shown), thereby integrating the first and second substrates 11a and 11b.

With such a construction, the ceramic first substrate 11a on which the circuit elements 5 including the crystal resonator 1 are disposed, and the glass epoxy resin second substrate 11b with external terminals 16c on the outside bottom face of the bottom surface, face each other and are electrically and mechanically connected. Furthermore, the front end side head section of the crystal resonator 1 enters the open surface of the opening section 12, thereby constructing the surface mounted oven controlled oscillator. Accordingly, in comparison to the conventional example in which the second substrate 11b joined to the first substrate 11a is held in place by metal pins P on the surface mounting base 13, the height dimension of the oven controlled crystal oscillator can be greatly reduced.

In other words, in the first embodiment, the thickness t1 of the surface mounting base 13, the clearance t2 to the second substrate 11b, and the clearance (t6+t7) from the circuit elements 5 to the top surface of the first substrate 11a of the conventional example shown in FIG. 11A can be eliminated. Furthermore, because the oven controlled oscillator of the first embodiment comprises only the thicknesses of the second substrate 11b, the first substrate 11a, and the circuit elements 5 (t3+t4+t5), the height dimension can be reduced significantly. Incidentally, the thickness t3 of the second substrate 11b at 1.2 mm is greater than in the conventional example (0.8 mm) and taller than the height of the crystal resonator 1, while the thickness t4 (0.5 mm) of the first substrate 11a and the maximum height t5 (0.8 mm) of the circuit elements 5 are similar to the conventional example. Accordingly, the overall height of the oven controlled oscillator of the first embodiment is 2.5 mm, that is, half the 5.0 mm height of the conventional example.

Furthermore, the first substrate 11a on which the crystal resonator 1 and the like are provided is made of ceramic, and the crystal resonator 1 and the like enter and are located inside the open surface of the opening section 12 of the second substrate 11b made of glass epoxy resin. Here, in addition to the crystal resonator 1, at least the heating resistor 5h and power transistor 5tr serving as the heat source thereof, and also the thermal sensor 5t enter the opening section 12 of the second substrate 11b. Furthermore, as shown in FIG. 5, surface mounting is performed onto a set substrate 17 made of glass epoxy resin on which the other electronic components are also installed.

Figure 5:
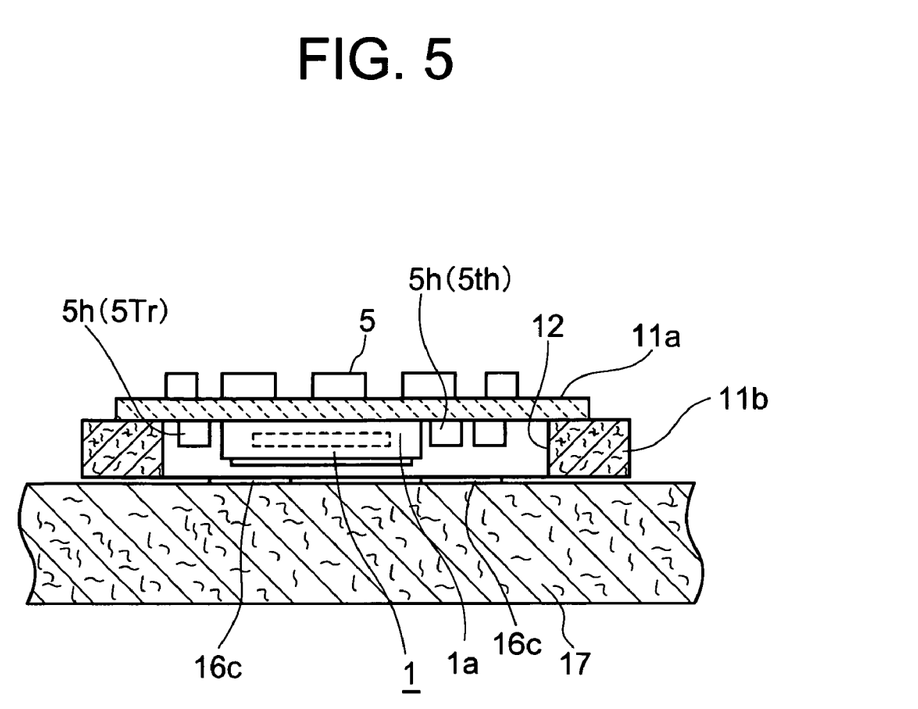
FIG. 5 is a cross-sectional view showing the oven controlled oscillator mounted to the set substrate, to illustrate the operation of the first embodiment of the oven controlled oscillator of the present invention.

Accordingly, as shown in FIG. 5, the crystal resonator 1 is surrounded such that the outside bottom surface faces the first substrate 11a (made of ceramic) which has the resistor as a heat source and offers good thermal conductivity, the four outside surfaces face the opening section 12 of the second substrate 11b (made of glass epoxy resin) having a shielding effect due to poor thermal conductivity, and the front end side head section (the metal cover 9 side, see FIG. 11B) faces the set substrate 17. In this case, the gap between the open surface of the second substrate 11b and the set substrate 17 is the total thickness of the external electrodes 16c of the second substrate 11b, the circuit terminals (not shown) of the set substrate 17, and the solder, that is, a mere 200 μm or thereabouts. Accordingly, the opening section 12 of the second substrate 11b forms a so-called pseudo-enclosed space.

Figure 1C:
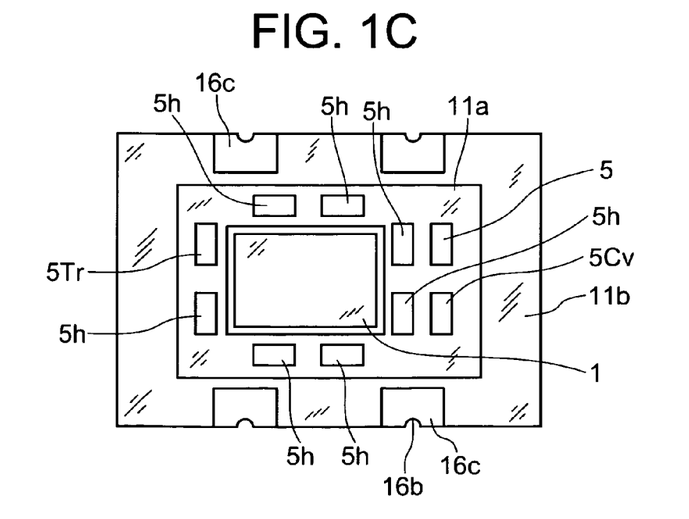
FIG. 1C is a bottom view.

Thus, the heat produced by the heating resistor 5h and power transistor 5tr shown in FIG. 1C is retained inside the opening section 12 and cannot easily escape, enabling the efficient utilization of heat energy and simplifying temperature control. Here, the heating resistor 5h and power transistor 5tr serving as the heat source, are disposed inside the pseudo-enclosed opening section 12. Accordingly, because the inside of the opening section 12 is heated directly, heat energy can be utilized particularly efficiently. Moreover, the thermal sensor 5th, being disposed inside the pseudo-enclosed space, can detect a temperature corresponding to the heating temperature of the crystal resonator 1, enabling temperature control in real time.

Figure 4B:
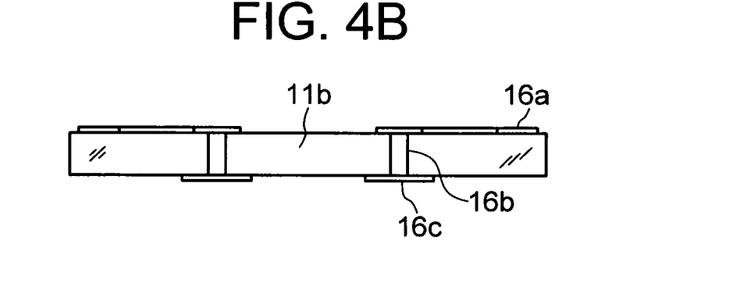
FIG. 4B is a front view.
Figure 4C:
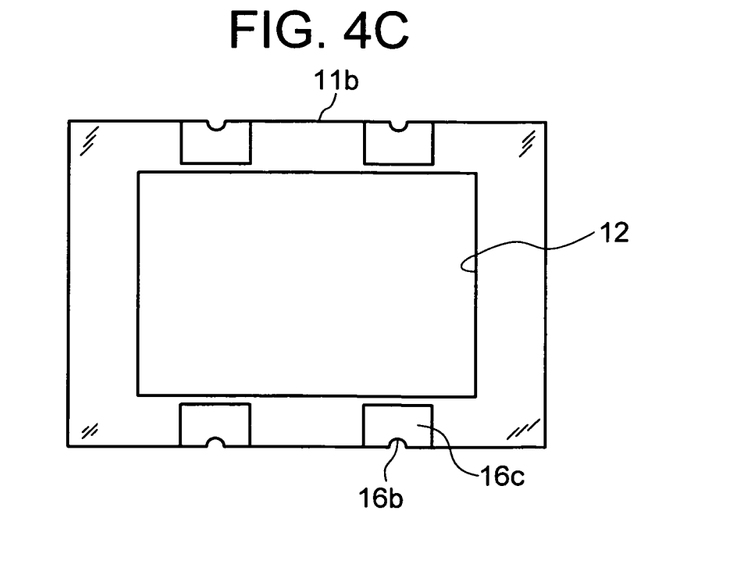
FIG. 4C is a bottom view.

Furthermore, as shown in FIG. 4, of the terminal sections 16a of the second substrate 11b corresponding to the four terminal sections 15c of the first substrate 11a, two are provided at each of the pair of opposing sides (both end sides in the length direction). Moreover, of the external terminals 16c of the second substrate 11b, two are provided at each of the other pair of opposing sides (both end sides in the width direction) orthogonal to the first pair of opposing faces. Accordingly, even if the plan view outer dimensions of the second substrate 11b are reduced, without an electrical short occurring between the terminal sections 16a and the external terminals 16c, the plan view outer dimensions can be made compact. For example, compared to a case in which two each of the terminal sections 16a and the external terminals 16c are provided at both ends in the length direction, the length direction is shortened giving a more compact flat shape. However, these terminal sections 16a and external terminals 16c can be provided at arbitrary locations including the four corner sections or the like as required.

Variations of the First Embodiment

Figure 6A:
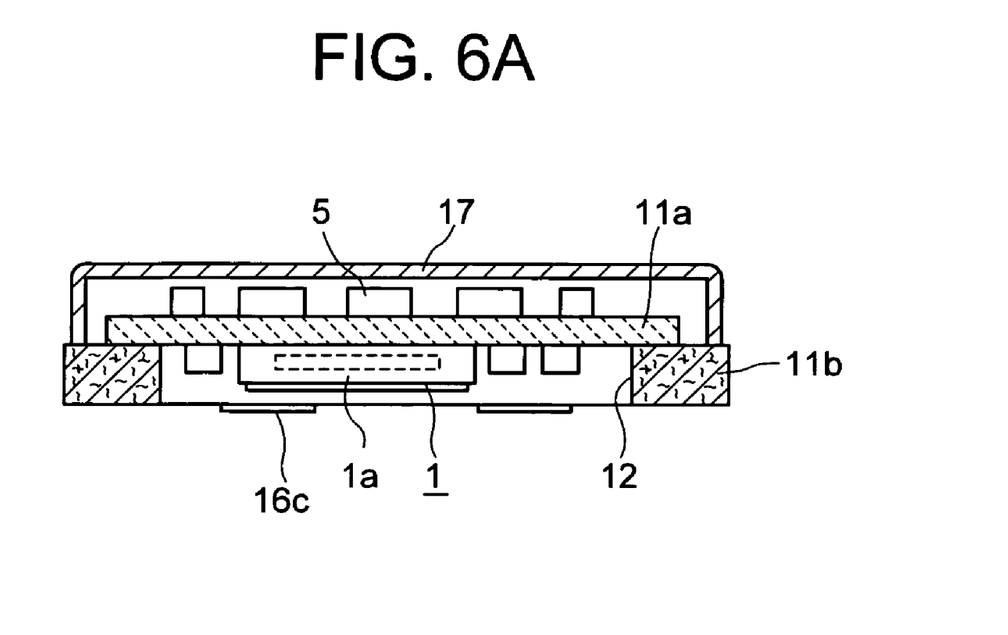
FIGS. 6A and 6B are cross-sectional views thereof.
Figure 6B:
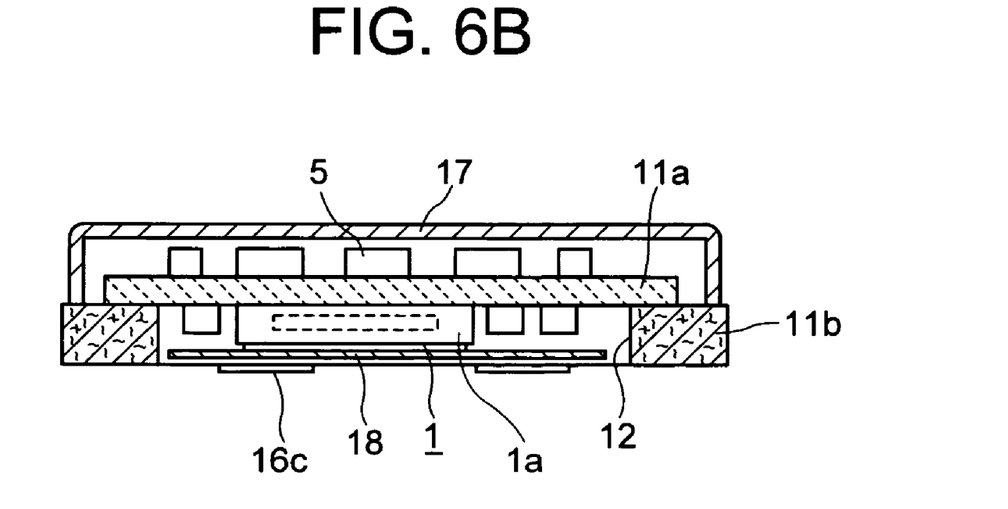

Here, for example, as shown in FIG. 6A, the open end surface of the concave-shaped in cross-section metal cover 17 is bonded to the periphery of the second substrate 11b, shielding against electrical fields from above. For example, a claw is provided at the open end surface of the metal cover 17 and inserted into electrode holes in the second substrate 11b. In addition, as shown in FIG. 6B, a metal plate 18, for example, is bonded to a metal cover 1a of the crystal resonator 1 as an EMI countermeasure so as to cover the circuit elements 5 disposed at the periphery thereof and provide shielding against electrical fields from below.

In this case, because the metal cover 1a of the crystal resonator 1 is earthed for shielding purposes, the metal plate 18 also serves as a shield. Naturally, a stepped portion into which the metal plate 18 is placed for shielding purposes can be provided on the open end surface of the second substrate 11b. However, in this case, the second substrate 11b adopts a layered construction, which is economically less advantageous. Such shielding functionality can be provided as required, which applies also to the embodiments described below.

Second Embodiment

In the second embodiment (see FIG. 7A, FIG. 7B) of the present invention, the heating resistor, instead of the chip element (heating resistor 5h) of the first embodiment, is a film resistor (heat resistor film) 5h', and the thermistor 5th serving as the thermal sensor is also a film resistor (thermistor film 5th'). Here, one principal surface (bottom surface side) of the first substrate 11a is formed so as to face the central region of the outside bottom surface of the crystal resonator 1. Furthermore, the thermistor film 5th' serving as the thermal sensor faces the outside bottom surface of the crystal resonator 1, and is formed adjacent to the heat resistor film 5h'. Moreover, at the outer periphery of the crystal resonator 1, the power transistor 5tr acting as a heat source, and the highly temperature-dependent voltage variable capacitative element 5Cv and the like are disposed. Reference numeral 19 in FIG. 7A includes the mounting terminals of the crystal resonator 1, and indicates the circuit terminals of the first substrate 11a and the connecting solder.

Figure 7A:
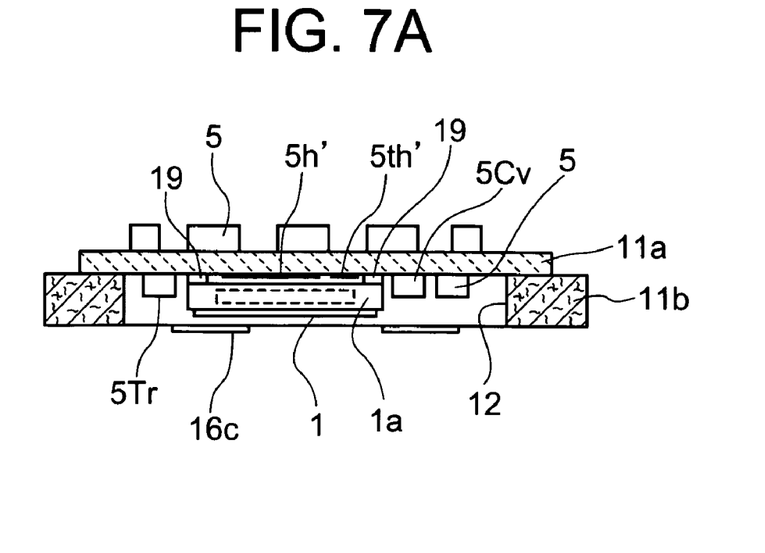
FIG. 7A is a cross-sectional view and FIG. 7B is a bottom view.
Figure 7B:
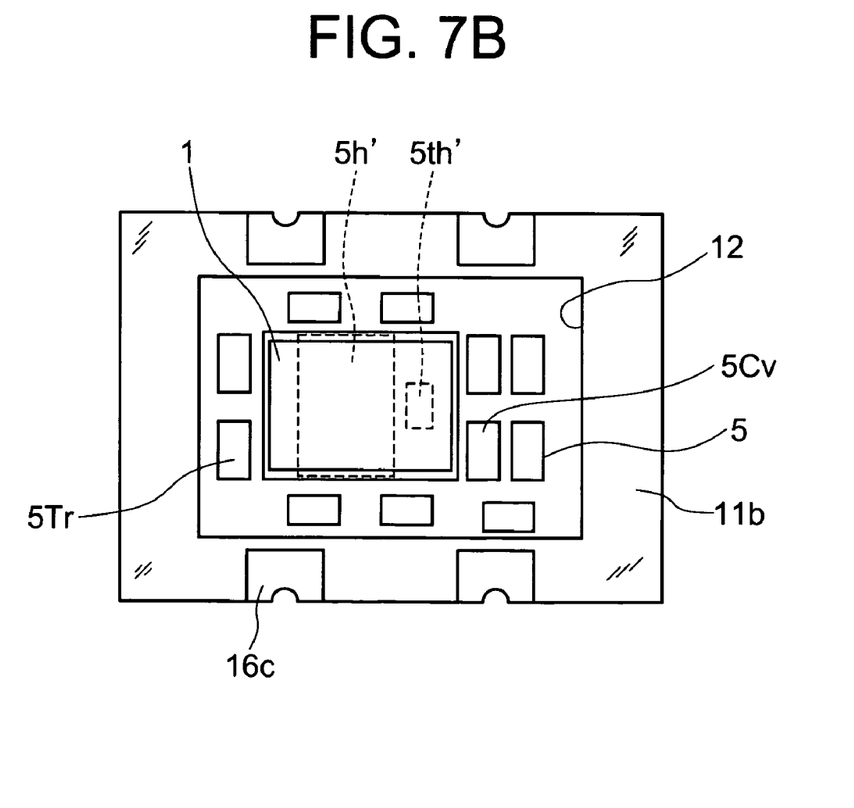

Thus, in the same manner as the first embodiment described earlier, the height dimension of the oven controlled oscillator can be reduced, while demonstrating such effects as efficient utilization of heat energy. Furthermore, here, in particular, because the heat resistor film 5h' closely faces the outside bottom surface of the crystal resonator 1, heat from the heat resistor film 5h' is transferred directly, imparting favorable responsiveness. Moreover, the heat resistor film 5h' can be placed in contact with the outside bottom surface of the crystal resonator 1, further enhancing responsiveness to heat transfer.

Variations of the Second Embodiment

Figure 8:
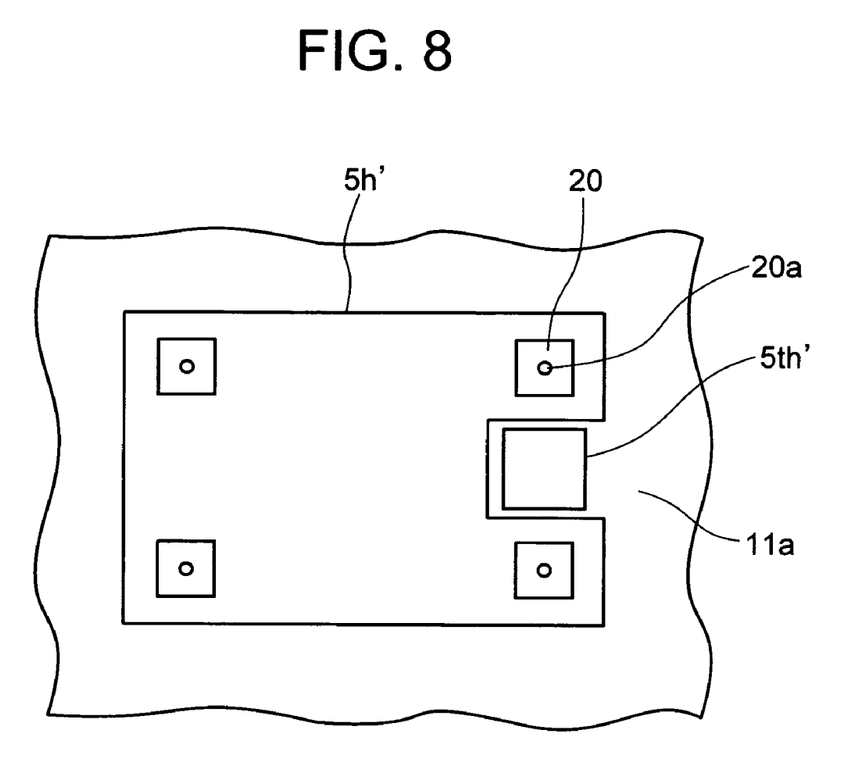
FIG. 8 is a partial bottom view of the second substrate for describing another example of the second embodiment of the oven controlled oscillator of the present invention.

Here, as shown in FIG. 8 (which is a partial bottom view of the bottom surface of the first substrate 11a), the heat resistor film 5h' faces the outside bottom surface of the crystal resonator 1, and is formed surrounding the circuit terminals 20 to which the mounting terminals of the crystal resonator 1 connect. In this case, the crystal terminals among the mounting terminals of the crystal resonator 1, for example the pair at diagonally opposing corners, are electrically connected to the excitation electrodes of the crystal blank 7. Accordingly, the heat resistor film 5h' which surrounds the circuit terminals 20 connected to the crystal terminals, directly heats the excitation electrode section which provides the operating temperature of the crystal resonator 1, improving heating efficiency. Furthermore, because the earth terminals which are the other pair of mounting terminals at diagonally opposing corners, are connected to the metal cover 1a by through electrodes (via holes) in the frame wall, the metal cover 1a is heated directly, further improving heating efficiency. Moreover, the circuit terminals 20 are electrically connected to the circuit pattern on the top surface side of the first substrate 11a by through electrodes 20a.

Third Embodiment

In a third embodiment (see FIG. 9A, FIG. 9B) of the present invention, an IC chip 21 which integrates most of the circuit elements 5 for oscillation and temperature control is disposed on a principal surface of the first substrate 11a by, for example, flip-chip bonding. The IC chip 21 is covered by a resin (not shown). Here, for example, integration is performed with the exception of the power transistor 5tr and the heat resistor film 5h', the thermistor film 5th', large capacitors and the like which are difficult to integrate, and, for example, circuit elements 5 which require their oscillation frequency to be adjustable. Furthermore, the entire surface of the other principal surface (top surface) opposite from the one principal surface of the first substrate 11a is exposed.

Figure 9A:
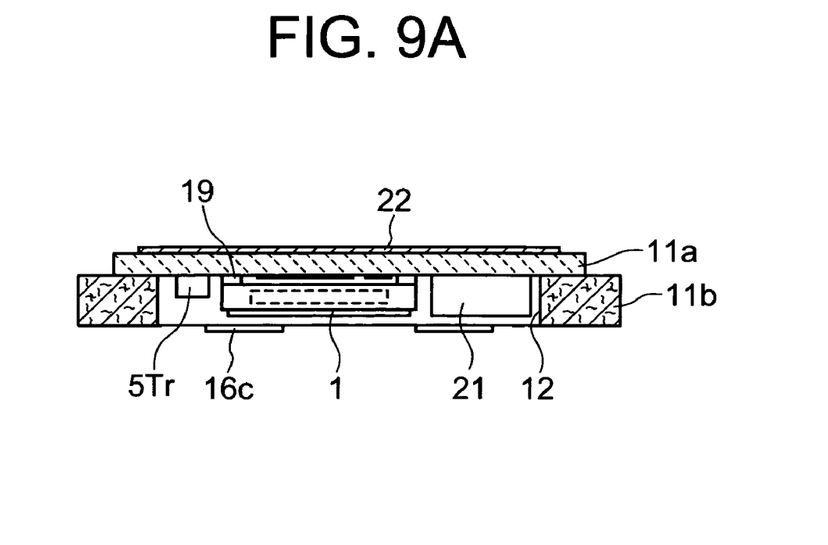
FIG. 9A is a cross-sectional view and FIG. 9B is a bottom view.
Figure 9B:
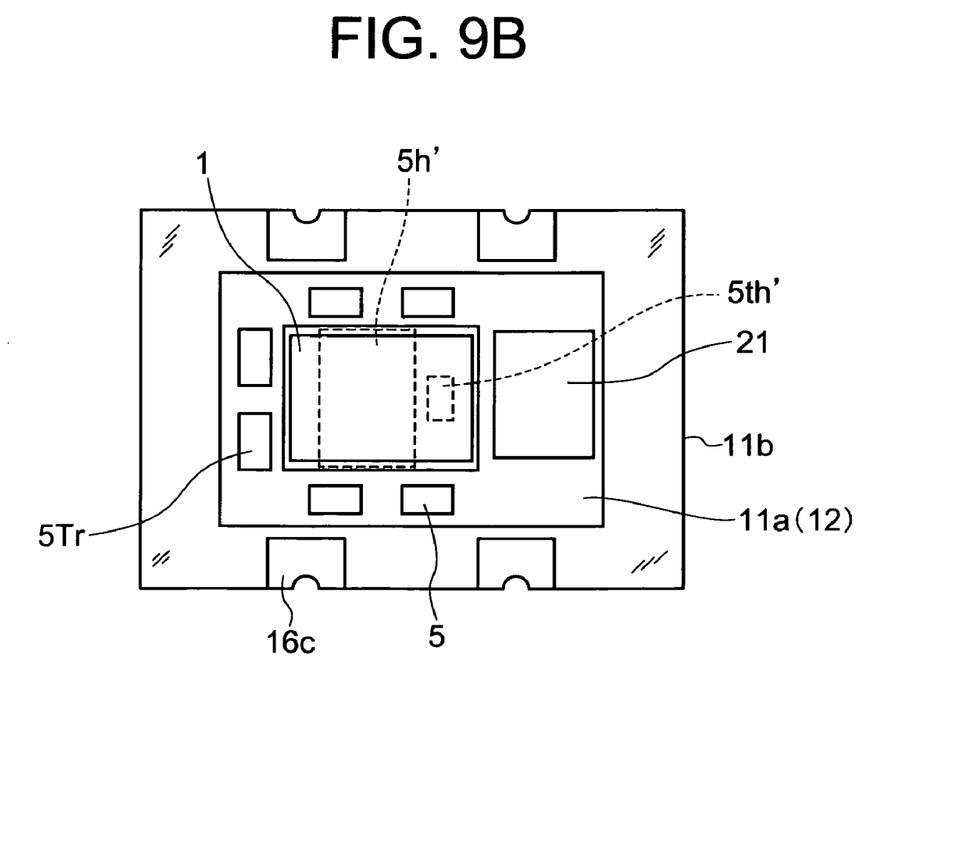

Thus, by eliminating the circuit elements 5 from the other principal surface of the crystal resonator 1, the height dimension of the oven controlled oscillator can be further reduced. In this example, as shown in FIG. 9A, on the other principal surface of the first substrate 11a, metal film 22 is formed for shielding purposes, which is electrically connected to the earthing external terminals 16c by conductive paths (not shown). Furthermore, the temperature control circuit 4 can be disposed as a discrete component on the one principal surface of the first substrate 11a, with integration limited to the oscillation circuit 3 only.

Fourth Embodiment

Figure 10A:
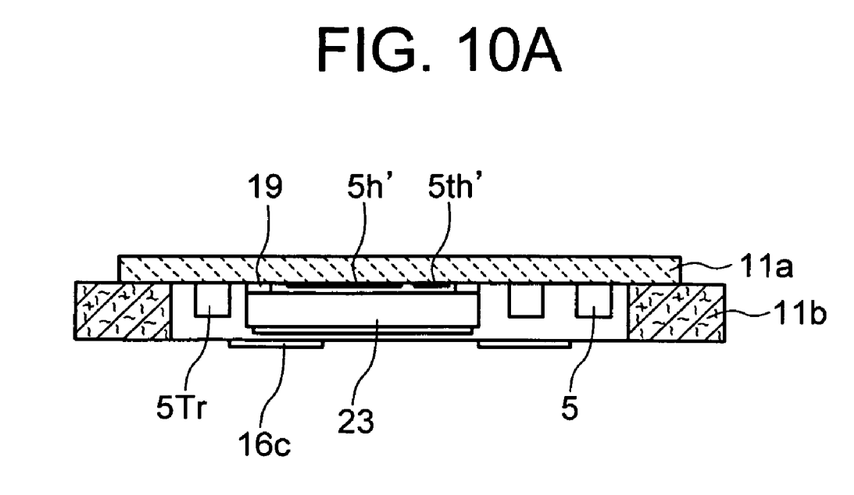
FIG. 10A is a cross-sectional view of the oven controlled oscillator.
Figure 10B:
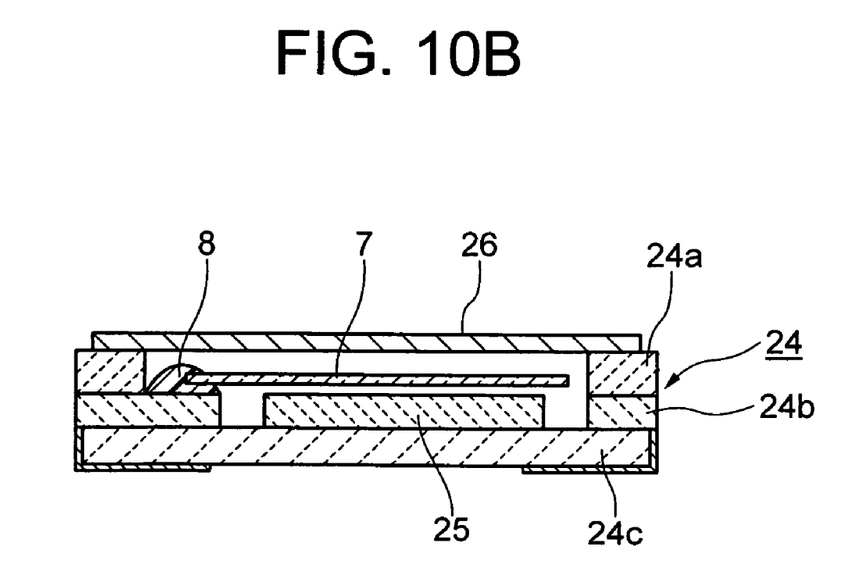
FIG. 10B is a cross-sectional view of the oven controlled oscillator.

In a fourth embodiment (see FIG. 10A, FIG. 10B) of the present invention, the surface mounted device is an oscillator 23 instead of the crystal resonator 1 of the preceding embodiments. In the oscillator 23, an IC chip 25 shown in FIG. 11A which integrates the oscillation circuit 3, is fixed to the inside bottom face of a chamber body 24 composed of laminated ceramics 24a, 24b, and 24c, by flip-chip bonding for example. Furthermore, both sides of one end of the crystal blank 7 are fixed to a stepped inside wall section of the chamber body 24 by a conductive adhesive 8, and a metal cover 26 is bonded to the open end surface to hermetically seal these components inside the chamber body 24. Here, the circuit elements 5 for temperature control and adjustment are disposed around the outer periphery of the surface mounted oscillator.

According to this fourth embodiment, because the oscillator 23 is formed discretely, the design is simplified. Moreover, for example, by using a temperature compensated type (a so-called TCXO) as the oscillator 23, even if the accuracy of the temperature control circuit 4 centered at 85° C., for example, is lessened, the temperature compensation mechanism of the TCXO enables highly accurate temperature compensation. Accordingly, the design of the temperature control circuit 4 shown in FIG. 11A is simplified.

What is claimed is:

1. An oven controlled crystal oscillator for surface mounting comprising:
    a flat first substrate made of ceramic which is quadrangular in plan view and on which are installed at least a surface mounted crystal device having mounting terminals on the outside bottom surface and a heat resistor; and
    a second substrate made of a glass epoxy resin which is quadrangular in plan view and which faces said first substrate in alignment in the length direction and the width direction and has a larger external shape in plan view than said first substrate,
    wherein said second substrate has an opening into whose center said crystal device is inserted, said crystal device has terminal sections at four locations corresponding to the surface outer periphery of said first substrate where said crystal device is installed and the peripheral surfaces of the opening in said second substrate,
    and the terminal sections of said first substrate and second substrate are electrically and mechanically connected by solder;
    wherein a front end side head section of said crystal device inserted into the opening section of said second substrate is positioned inside the open surface of said opening section, and from terminal sections provided at four locations on said second substrate, conductive paths extend via the outside surface of said second substrate to external terminals formed on the outside bottom surface.

2. An oven controlled crystal oscillator according to claim 1, wherein the terminal sections are formed at four locations of said second substrate, two each are provided on each of a pair of opposing sides, and two each of the external terminals of said second substrate are provided on each of the other pair of opposing sides orthogonal to said first pair of opposing sides.

3. An oven controlled crystal oscillator according to claim 1, wherein said quadrangular shape is a rectangle, with the one pair of opposing sides where two each of said terminal sections are provided being the sides in the length direction, and the other pair of opposing sides where two each of said mounting terminals are provided being the sides in the width direction.

4. An oven controlled crystal oscillator according to claim 1, wherein, on the one principal surface of said first substrate, said crystal device and at least said heating resistor are provided and inserted into the opening section in said second substrate.

5. An oven controlled crystal oscillator according to claim 4, wherein said heating resistor is formed as a film resistor on the one principal surface of said first substrate so as to face the outside bottom surface of said crystal device.

6. An oven controlled crystal oscillator according to claim 1, wherein said crystal device is composed of a crystal resonator hermetically sealing a crystal blank, and on the one principal surface of the first substrate where said crystal resonator is disposed and also on the other principal surface on the opposite side, circuit elements other than said heating resistor, for oscillation and temperature control are disposed.

7. An oven controlled crystal oscillator according to claim 6, wherein said circuit elements are disposed on the one principal surface and the other principal surface of said first substrate, the circuit elements disposed on at least one of the principal surfaces are covered by a metal cover for electric field shielding.

8. An oven controlled crystal oscillator according to claim 1, wherein said crystal device is composed of a crystal resonator hermetically sealing a crystal blank, and a circuit element including an IC chip which integrates at least an oscillation circuit is disposed on the first principal surface of the first substrate where said crystal resonator is installed, with the entire surface of the other principal surface of said first substrate left exposed.

9. An oven controlled crystal oscillator according to claim 8, wherein, on the other principal surface of said first substrate, a metal film for shielding is formed.

10. An oven controlled crystal oscillator according to claim 1, wherein said crystal device is a crystal oscillator which hermetically seals a crystal blank and an IC chip that integrates at least an oscillation circuit.

* * * * *